United States Patent [19]

Romanofsky et al.

[11] Patent Number: 4,980,636
[45] Date of Patent: Dec. 25, 1990

[54] UNIVERSAL NONDESTRUCTIVE MM-WAVE INTEGRATED CIRCUIT TEST FIXTURE

[75] Inventors: Robert R. Romanofsky, Brookpark; Kurt A. Shalkhauser, North Olmsted, both of Ohio

[73] Assignee: The United States of America as represented by the Administrator, National Aeronautics and Space Administration, Washington, D.C.

[21] Appl. No.: 392,239

[22] Filed: Aug. 10, 1989

[51] Int. Cl.$^5$ .......................... G01R 1/00; G01R 1/04
[52] U.S. Cl. ........................... 324/158 F; 324/158 P; 324/601; 333/247
[58] Field of Search ............... 333/246, 247; 324/601, 324/637, 632, 629, 630, 639, 645, 642, 58 R, 58 A, 58 B, 158 F, 158 P

[56] References Cited

U.S. PATENT DOCUMENTS

| | | | |
|---|---|---|---|
| 3,553,409 | 1/1971 | Lehnfeld | 333/246 |
| 3,617,877 | 11/1971 | Hobson | 324/601 |
| 3,875,542 | 4/1975 | Holland et al. | 333/246 |
| 4,431,974 | 2/1984 | Landt | 333/247 |
| 4,535,307 | 8/1985 | Tsukii et al. | 333/35 |
| 4,538,124 | 8/1985 | Morrison | 333/246 |
| 4,680,538 | 7/1987 | Dalman et al. | 324/58 |
| 4,697,143 | 9/1987 | Lockwood et al. | 324/158 |
| 4,789,840 | 12/1988 | Albin | 333/247 |
| 4,816,789 | 3/1989 | Mars | 333/246 |
| 4,851,764 | 7/1989 | Usui | 324/158 F |
| 4,853,613 | 8/1989 | Sequeira et al. | 324/601 |
| 4,858,160 | 8/1989 | Strid et al. | 324/601 |

OTHER PUBLICATIONS

R.F. Characterization of Monolithic Microwave and mm-Wave ICs, NASA Technical Memorandum 88948, R. R. Romanofsky et al., 11/86.

Primary Examiner—Reinhard J. Eisenzopf
Assistant Examiner—William J. Burns
Attorney, Agent, or Firm—James A. Mackin; Gene E. Shook; John R. Manning

[57] ABSTRACT

An MMIC test fixture includes a bias module having spring-loaded contacts which electrically engage pads on a chip carrier disposed in a recess of a base member. RF energy is applied to and passed from the chip carrier by chamfered edges of ridges in the waveguide passages of housings which are removably attached to the base member. "Thru", "Delay" and "Short" calibration standards having dimensions identical to those of the chip carrier assure accuracy and reliability of the test. The MMIC chip fits in an opening in the chip carrier with the boundaries of the MMIC lying on movable reference planes thereby establishing accuracy and flexibility.

6 Claims, 5 Drawing Sheets

UNIVERSAL NONDESTRUCTIVE MM-WAVE INTEGRATED CIRCUIT TEST FIXTURE

ORIGIN OF THE INVENTION

The invention was made by employees of the United States Government and may be manufactured or used by or for the Government without the payment of any royalties thereon or therefor.

TECHNICAL FIELD

This invention relates to apparatus for making characterization tests of monolithic microwave integrated circuits (MMICs) at millimeter wavelengths. It is directed more particularly to a fixture in which an MMIC circuit can be nondestructively mounted for testing. Typically, an MMIC must be mounted in a fixture which provides a means to connect the chip to a network analyzer by coaxial cables or rectangular waveguides. In either case, the measurement plane is removed from the physical MMIC terminals by the fixture geometry.

At the present time, conventional fixtures require that electrical connections be made to various points on the chip. These connections can damage the chip or alter its characteristics either on attachment or removal. Therefore, noninvasive, nondestructive techniques must be established. Furthermore, conventional fixtures must be modified for each type of device to be tested, thereby compromising measurement accuracy and repeatability.

The characterization of solid state devices such as MMICs poses numerous problems at and above the K-band due to parasitic currents which introduce inaccuracy and nonrepeatability in radio frequency (RF) measurements. Packaging and interconnect are critical as is the transition from the device to the test port.

Recently, MMICs have becomed very important in applications such as phased array antenna technology which requires a large cluster of radiating elements. In designing these phased arrays, extremely accurate data characterizing each MMIC must be available to insure predictable performance. Thus, it is desirable to accurately and nondestructively characterize MMICs while, at the same time, minimizing the time required for such testing.

BACKGROUND ART

U.S. Pat. No. 4,535,307 to Tsukii discloses a test fixture for characterizing electrical devices such as field effect transistors. The fixture includes a base portion comprising a holder for receiving a solid state device positioned on a substrate. Transmission line sections which may include a straight line or a serpentine line section mounted on a substrate with a ground plane layer are disposed adjacent to the solid state device under test, but on opposite sides thereof. Slideable tuning elements are attached to the top of the fixture to allow testing at various frequencies.

U.S. Pat. No. 4,697,143 to Lockwood et al discloses a wafer type probe for the measurement of electrical characteristics of small planar devices fabricated on semi-conductive or dielectric wafers. The probe is provided with metallic transmission lines mounted on a tapered alumina substrate, generally surrounded by microwave absorbing material. This material absorbs energy propagating along the probe ground, thereby preventing the energy from resonating, radiating, or reexciting normal transmission line modes with minimal transmission line mode residence along the ground probe.

U.S. Pat. No. 4,680,538 to Dalman et al is directed to a swept-frequency analyzer which is constructed of standard microwave passive components and a controlled frequency sweeper and is used to make both reflection and transmission measurements with only two power meters. The simplicity of this device is based on the use of a 180° hybrid, or "magic-tee" waveguide device, and allows accurate point-by-point measurements of device coefficients over a broad frequency band.

DISCLOSURE OF THE INVENTION

In accordance with the invention, there is provided a test fixture comprising an elongated base member having in its upper surface a recess to accept a chip carrier on which is mounted an MMIC device. The chip carrier includes a plurality of bias pads by which appropriate voltages and signals are applied to the MMIC. A bias module having a plurality of spring-loaded contacts is disposed over the chip carrier with the spring-loaded contacts electrically engaging respective ones of the bias pads.

Abutting each side of the bias module is a ridge transition housing including a microwave transfer passage. In each of the housings a ridge extends downwardly in the microwave transfer passage and contacts the edge of the chip carrier at points which are connected through transmission lines on the surface of the carrier to the MMIC. The ridges are thinner at the points of contacts with the chip carrier and, moving in a direction away from the chip carrier, the height of the ridge decreases in a predetermined cosine taper.

It is an object of the invention to provide a fixture for a nondestructively testing MMIC chips rapidly by incorporating them onto a support structure to which no wires are attached.

It is another object of the invention to provide an MMIC testing device having great accuracy and repeatability in RF measurements.

Still another object of the invention is to provide an environment for the device which facilitates testing, handling, and insertion into subsystems.

It is yet another object of the invention to provide a method for characterizing a wide variety of devices using a calibration technique requiring only a single set of dimensionally identical calibration standards to improve accuracy and repeatability.

A further object of the invention is to provide a nondestructive MMIC testing apparatus which provides for the transition from a transmission device, such as a waveguide, to microstrip, coplanar lines or the like, while providing broad bandwidth and low signal losses.

An additional object of the invention is to provide an MMIC testing device in which d-c bias filters and direct current isolation features are incorporated into a chip carrier.

It is a further object of the invention to provide an MMIC testing fixture in which a chip carrier and a set of calibration standards all include identical bias filters and d-c isolation coupling sections whereby their effects on measurements are negated.

Still another object of the invention is to provide an MMIC testing apparatus in which measurement planes perpendicular to the plane of the MMIC lie at the boundaries of the MMIC under test.

An important object of the invention is to provide an MMIC test fixture having a delay calibration standard which utilizes a unique curved portion to provide a predetermined electrical delay for the specific RF frequency range of operation of the fixture.

BRIEF DESCRIPTION OF THE DRAWING

The details of the invention will be described in connection with accompanying drawings, in which.

BEST MODE FOR CARRYING OUT THE INVENTION

Figure 1:
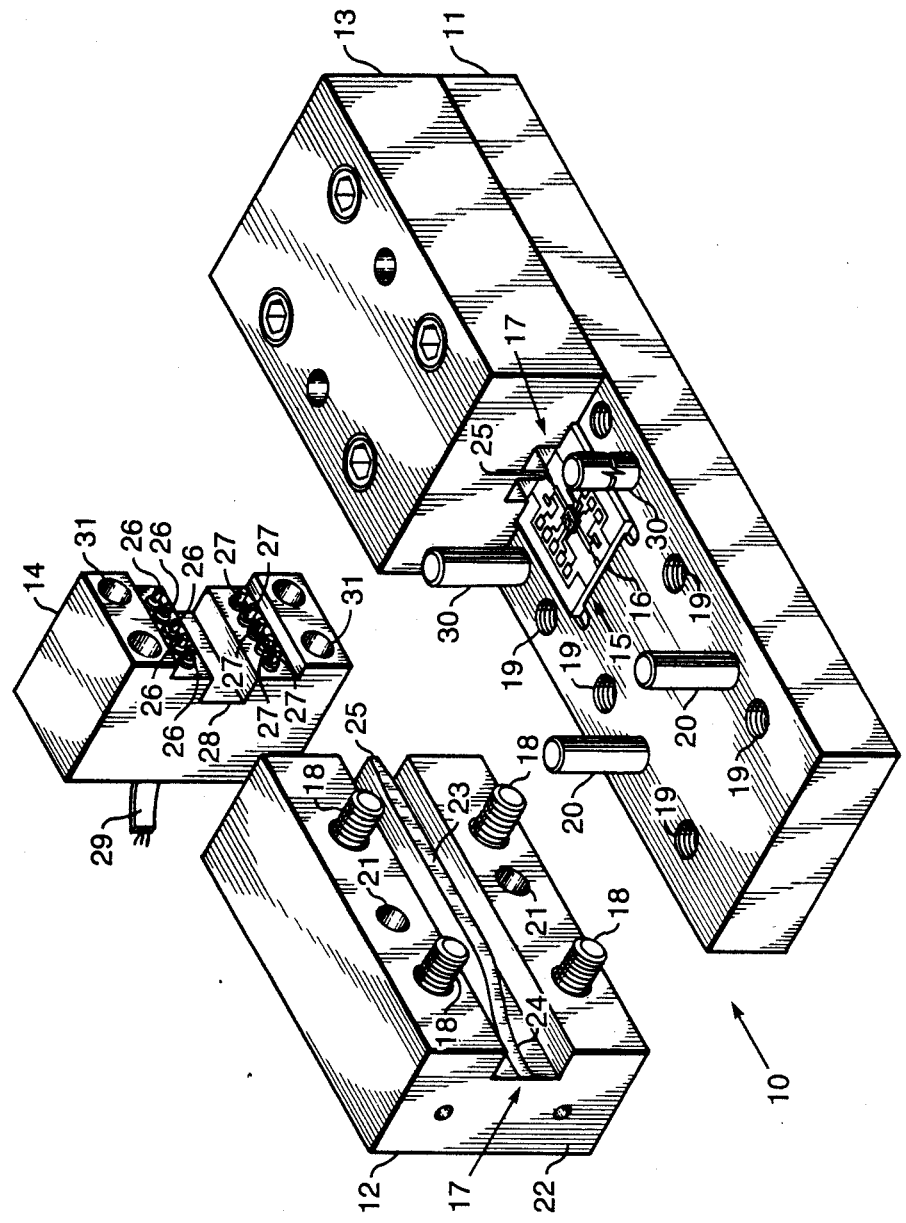
FIG. 1 is an oblique, partially exploded view of a fixture embodying the invention.

Referring now to FIG. 1, there is shown an MMIC test fixture 10 which is comprised of an elongated, rectangular base 11 ridge transition housings 12 and 13 and a bias module 14. A shallow recess 15 is provided in the upper surface of the base 11 to receive a chip carrier 16.

To provide for the passage of RF energy from an RF waveguide to the chip carrier 16 and subsequently to an MMIC thereon, a three-sided passageway 17 is provided in the lower surface of the ridge transition housing 12. The passageway 17 will, with the upper surface of the base 11, form a waveguide when the housing 12 is disposed on base 11. Attachment of the housing 12 to the base 11 is accomplished by bolts 18 which thread into holes 19 in the base. Proper alignment of the housing 12 with the base 11 is provided by alignment pins 20 which engage receptacles 21 in the housing 12.

Because RF energy must be transferred between a waveguide (not shown) and the chip carrier 16, impedance matching is required. This is accomplished in the MMIC testing fixture of the invention by means of a cosine-tapered ridge 23 extending downwardly in the housing 12 into the three-sided passageway 17.

The ridge 23 decreases in height in accordance with a predetermined curvature 24 with the ridge height being zero at a waveguide attaching surface 22 of the housing 12. At its opposite end, the ridge 23 is chamfered on both sides to provide a narrow edge which will electrically contact a transmission line on the chip carrier as will be explained in more detail later.

The ridge transition housing 13 is identical in function to the housing 12. The fastening mechanism is unique to each piece to prevent interchange which may degrade electrical performance.

To the end that required voltages, such as bias voltages and the like, will be supplied to MMIC on the chip carrier 16, a plurality of spring-loaded contacts 26 and 27 are provided on respective opposite sides of a three-sided channel 28 provided in the lower surface of module 14. The spring-loaded contacts make electrical contact with respective pads on the chip carrier 16 as will be shown in FIG. 2. Of course, to provide electrical voltages or signals on the contacts 26 and 27, one or more electrical wires must be connected to each, as for example by a cable 29. Alignment pins 30 on the base 11 are aligned with holes 31 in the bias module 14 to properly position the latter. Suitable bolts may be used to hold the module 14 in position on the base 11.

Figure 2:
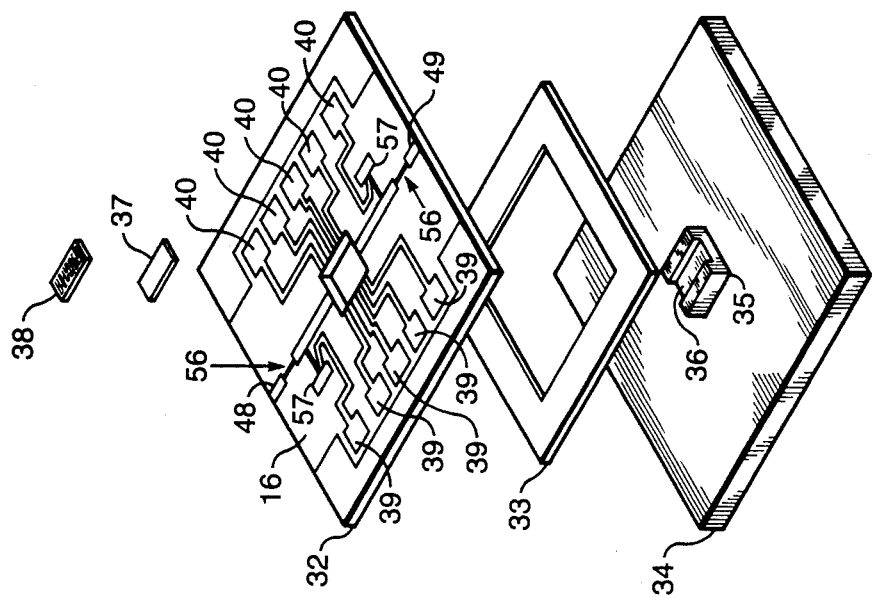
FIG. 2 is an oblique, exploded view of a chip carrier.

Referring now to FIG. 2, there is shown an enlarged, exploded view of the chip carrier 16 of FIG. 1 comprising a carrier layer of 32, a solder preform 33, and a subcarrier layer 34. The subcarrier layer 34 is made of an electrically conducting material with a low thermal coefficient of expansion.

A mesa 35 located in the center of the subcarrier includes a notch 36 into which fits a conductive epoxy preform 37 and, on top of that, an MMIC 38 to be tested. Electrical signals and/or voltages for the MMIC 38 are obtained from electrical pads 39 and 40 which are located on the carrier layer 16 in positions to make electrical contact with respective ones of the spring-loaded contacts 26 and 27 of the bias module 14.

Also incoporated on the chip carrier are coupled line sections 56 which provide d-c electrical isolation between the tapered ridge 23 and the MMIC 38. The coupled line sections 56 permit the passage of RF energy to the MMIC 38 while preventing direct current continuity. Bias filters 57 on chip carrier 16 enable the connection of bias voltages directly to the RF input and RF output of the chip 38 without interfering with the RF signal.

Figure 3:
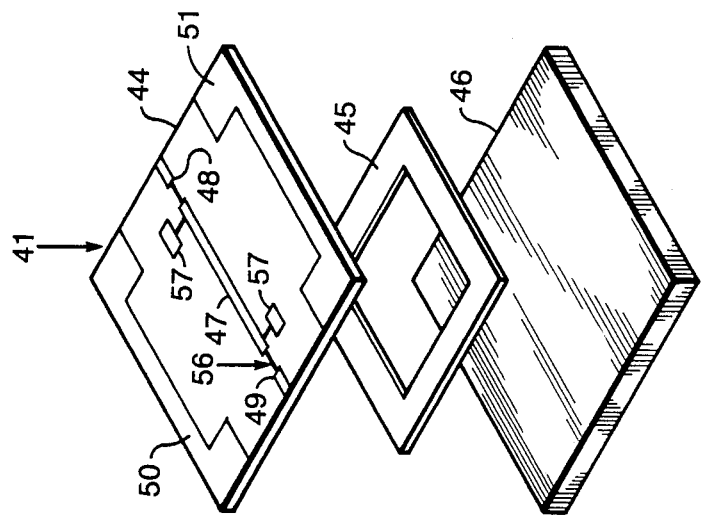
FIG. 3 is an oblique, exploded view of a transmission line calibration insert.
Figure 5:
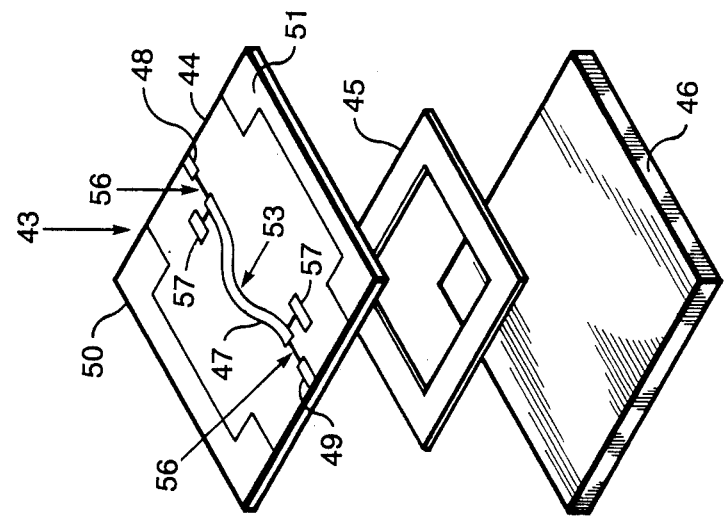
FIG. 5 is an oblique, exploded view of a "delay" calibration insert.
Figure 4:
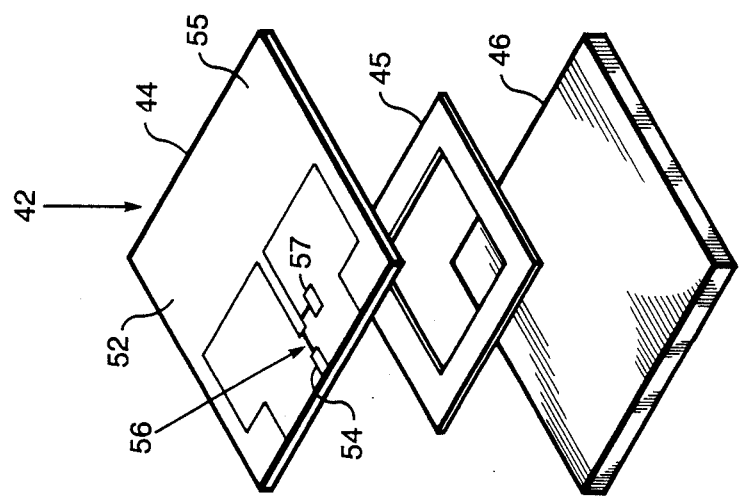
FIG. 4 is an oblique, exploded view of a "short" calibration insert.

Also shown in FIGS. 3, 4, and 5, respectively are three calibration standard inserts 41, 42 and 43, which are used to calibrate the equipment supplying the RF energy and the electrical voltages needed to test an MMIC. A "through" calibration insert is identified as 41, a "short" calibration insert is 42 and a "delay⇌ calibration insert is 43. Each of the calibration standards 41, 42, and 43 is comprised of a top calibration pattern layer 44, an intermediate solder preform 45, and a lower brass shim 46. The top layer 44 of the "through" calibration device 41 has disposed thereon a thin metallic film comprising a transmission line 47 with end portions 48 and 49 together with continuity members 50 and 51.

When the calibration standard 41 is inserted in the receptacle 15 in the base 11 and housings 12 and 13 of bias module 14 are in place, end portions 48 and 49 are in electrical contact with the chamfered ends 25 of the ridges 23. Similarly, continuity members 50 and 51 provide metallic continuity between the housing 12 and 13. Thus, with 41 in place, and RF energy supplied to the test fixture, the equipment utilized with the test fixture 10 may be calibrated as an RF pass through.

The insert 42 of FIG. 4 provides for RF "short" calibration of test fixture 10. The top layer 44 has disposed thereon a thin metallic film 52 and is similar to the pattern of insert 41, except that the film 52 completely covers the right-hand half of the calibration layer 44 as viewed in the drawing. With insert 42 in place in fixture 10, end portion 54 makes contact with the edge 25 of whichever of the housings 12 or 13 is receiving RF energy from a waveguide attached to the surface 22 of FIG. 1.

Figure 6:
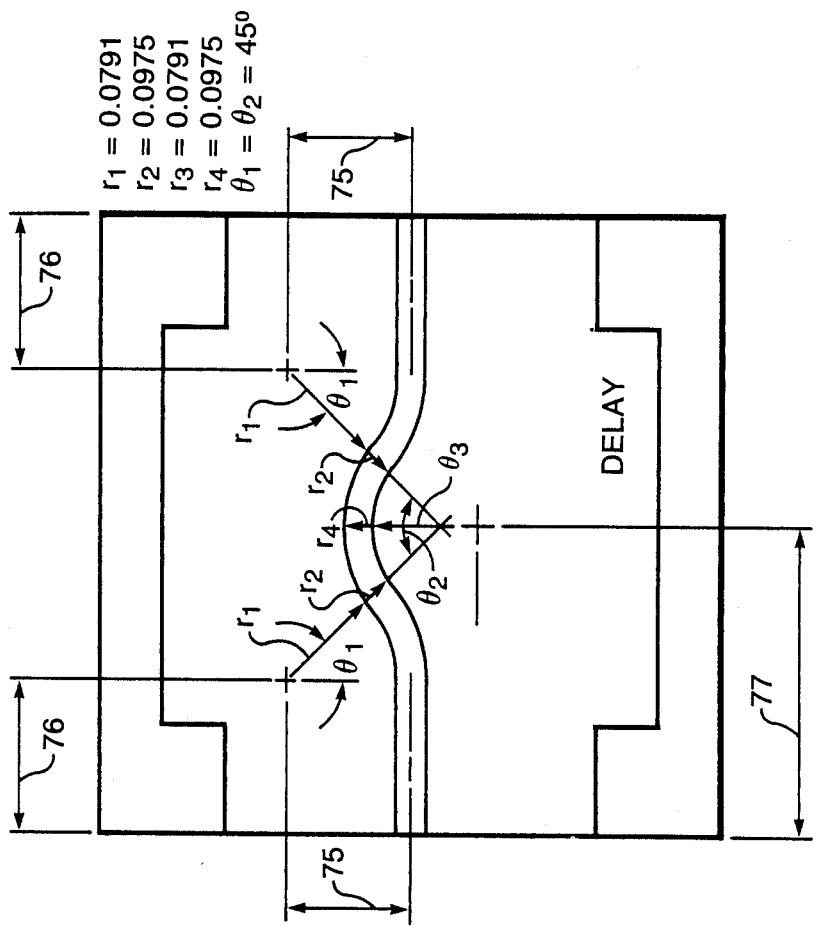
FIG. 6 is a plan view of an RF delay calibration insert.

Insert 43 of FIGS. 5 and 6 is the "delay" calibration insert and because the metallic film is a pattern very similar to that of insert 41, like numerals will be used for identification. Thus, 47 is a transmission line having end portions 48 and 49, while 50 and 51 provide electrical continuity between the housing 12 and 13 of the test fixture 10 shown in FIG. 1. The significant difference between inserts 43 and 41 is that, as shown at 53, the transmission line 47 includes a curved section 53 which delays an RF signal propagated along the transmission line 47.

The curved section 53 is comprised of four contiguous arcs each being a 45° part of a circle. The radius of curvature of each of the arcs is, of course, determined by the operational RF frequency range of the fixture as well as the amount of electrical delay desired.

In the test fixture embodying the invention, an RF electrical delay of from about 15 to about 165 electrical degrees is generally desired with about 65 to about 95 electrical degrees being preferred.

Because the delay calibration circuit 43 is significantly different from the "thru" and "short" calibration circuits, 41 and 42, respectively, it is shown in greatly enlarged plan view in FIG. 3. The various dimensions represented by arrows 75–76, radii $r_1$–$r_4$ and angles $\theta_1$ and $\theta_2$ are given in TABLE I.

As viewed in FIG. 6, starting from either end of the transmission line 47, the first arc curves away from 47, the second arc curves in the opposite direction, the third arc continues the curve of the second arc so that the sum of the second and third arcs is 90° of a circle, and the fourth arc curves oppositely to the third arc and merges smoothly with the transmission line 47.

The curved section 53 advantageously allows the delay calibration standard 43 to be a fixed size, rigid component. This is in contrast to the prior art in which long and short linear sections were required to obtain specific delays for each MMIC.

Figure 8:
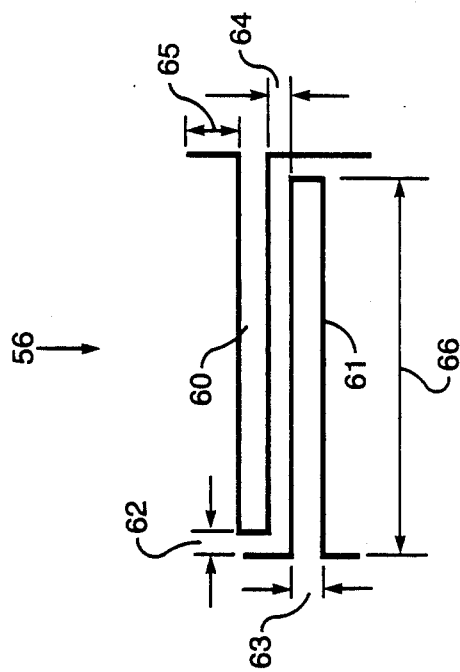
FIG. 8 is an enlarged plan view of the d-c coupling section of the chip carrier of FIG. 7.
Figure 7:
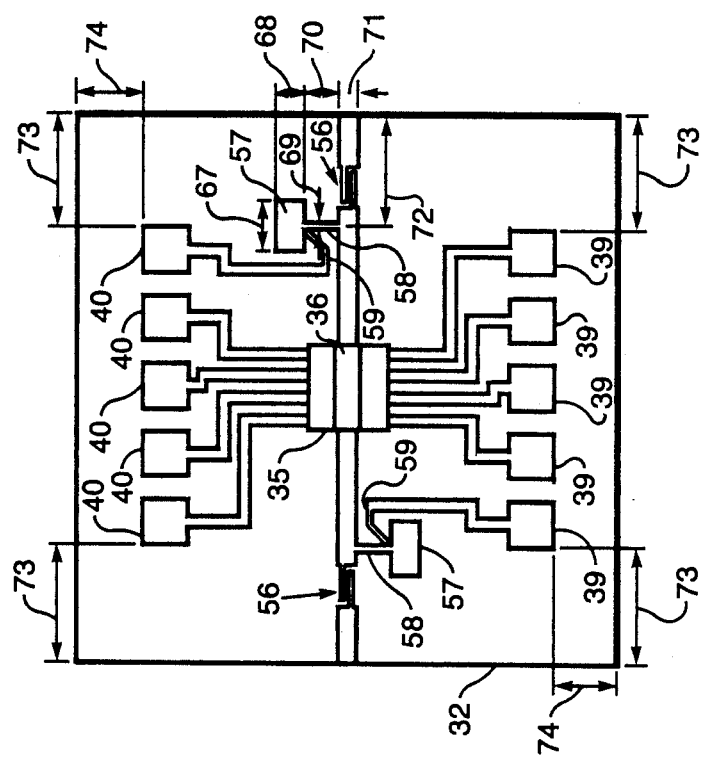
FIG. 7 is an enlarged plan view of the chip carrier of FIG. 2.

Referring now to FIG. 7 there is shown an enlarged plan view of the chip carrier 32 with an enlarged detail of the coupled line sections 56, each of which comprises coupling members 60 and 61 being shown in FIG. 8. The dimensions represented by the arrows 62–66 are set forth in TABLE II. Likewise, the size positioning and connector dimensions for the d-c bias filters 57, as represented by arrows 67–72 are shown in TABLE II. Finally, TABLE II shows the distance of the pads 39 and 40 from the edges of the chip carrier 32 as represented by arrows 73 and 74.

TABLE I

| ARROW(S) NO. | DIMENSION |
| --- | --- |
| 75 | 0.0883 inches |
| 76 | 0.125 inches |
| $r_1$ | 0.0791 inches |
| $r_2$ | 0.0975 inches |
| 1 | 45° |
| 2 | 90° |

TABLE II

| | ARROW(S) NO. | DIMENSION |
| --- | --- | --- |
| COUPLED TRANSMISSION LINE SECTIONS | 62 | 0.0020 inches |
| | 63 | 0.0029 inches |
| | 64 | 0.0020 inches |
| | 65 | 0.0053 inches |
| | 66 | 0.0340 inches |
| d-c bias filters and positioning | 67 | 0.0500 inches |
| | 68 | 0.0270 inches |
| | 69 | 0.0030 inches |
| | 70 | 0.0310 inches |
| | 71 | 0.0184 inches |
| | 72 | 0.1020 inches |
| d-c bias pads | 73 | 0.105 inches |

Pads 39 and 40 are approximately 0.042×0.042 inches with 0.200 inches separation between pads.

Chip carrier 32 and calibration standards 41, 42 and 43 are approximately 0.5 inches square.

Transmission lines 47 are approximately 0.0184 inches in width as represented by double ended arrow 71.

In view of the foregoing description, it will be seen that the invention embodies a fixture for testing MMICs nondestructively, relatively quickly and with a minimum amount of parasitic signals. It will be understood that changes and modifications may be made to the above-described invention without departing from its spirit and scope as set forth in the claims appended hereto.

We claim:

1. An MMIC test fixture in which the measurement planes can be positioned directly adjacent to the MMIC edges and comprising:

an elongated rectangular base including a shallow recess in the base upper surface;

first and second ridge transition housings each including a three-sided elongated trench in a lower surface, said trench with the upper surface of said base forming a guide for RF waves when the lower surfaces of the housings are placed in contact with the upper surface of said base, an elongated ridge member extending into said trench from the housing and having length, height and thickness, the thickness of the ridge member being reduced toward one end, the height being reduced to zero at the other end by a cosine taper;

a chip carrier having a transmission line disposed thereon and having a plurality of electrical contact pads connected to respective electrical contacts on two opposite edges of an aperture in said chip carrier said edges being parallel to said RF transmission line, said aperture being adapted to receive an MMIC having bias contacts and RF contacts, said chip carrier being disposed in the recess of said base;

a bias module having a plurality of spring-loaded contacts which engage respective ones of the pads of said chip carrier to provide appropriate voltages to the MMIC; and a solder preform beneath said chip carrier and an electrically conductive subcarrier beneath said solder preform, said subcarrier including an electrically nonconductive mesa extending upwardly through said solder preform and into an aperture in said chip carrier, said mesa being embedded in an upper surface of the subcarrier, said MMIC lying in a plane common with that of the RF transmission line of said chip carrier.

2. The fixture of claim 1 wherein the gradual reduction of thickness of the ridge member is effected over less than 20% of the ridge member length.

3. The fixture of claim 1 wherein the thickness of the ridge at said one end is less than 25% of the normal thickness.

4. The fixture of claim 1 wherein the reduction of the thickness of said ridge is effected by chamfers.

5. The fixture of claim 1 wherein the reduction of thickness of said ridge is effected by a smooth, continuous curve on each side surface of the ridge.

6. The fixture of claim 1 wherein the subcarrier has a low thermal coefficient of expansion.

* * * * *